(12) United States Patent
Nakamura et al.

(10) Patent No.: US 12,051,587 B2
(45) Date of Patent: Jul. 30, 2024

(54) SUBSTRATE PROCESSING APPARATUS, ESTIMATION METHOD OF SUBSTRATE PROCESSING AND RECORDING MEDIUM (71) Applicant: Tokyo Electron Limited, Tokyo (JP)

(72) Inventors: Hiroshi Nakamura, Koshi (JP); Masahide Tadokoro, Koshi (JP); Masashi Enomoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 390 days.

(21) Appl. No.: 17/346,638

(22) Filed: Jun. 14, 2021

(65) Prior Publication Data
US 2021/0387224 A1 Dec. 16, 2021

(30) Foreign Application Priority Data

Jun. 15, 2020 (JP) ................. 2020-102961

(51) Int. Cl.
| | |
|---|---|
| H01L 21/02 | (2006.01) |
| B05C 5/02 | (2006.01) |
| B05C 11/00 | (2006.01) |
| G03F 7/16 | (2006.01) |
| G03F 7/20 | (2006.01) |
| H01L 21/302 | (2006.01) |
| H01L 21/306 | (2006.01) |
| H01L 21/66 | (2006.01) |
| H01L 21/67 | (2006.01) |

(52) U.S. Cl.
CPC ........ *H01L 21/02343* (2013.01); *B05C 5/022* (2013.01); *B05C 11/00* (2013.01); *G03F 7/162* (2013.01); *G03F 7/2028* (2013.01); *H01L 21/302* (2013.01); *H01L 21/306* (2013.01); *H01L 21/6708* (2013.01); *H01L 21/6715* (2013.01); *H01L 21/67253* (2013.01); *H01L 21/67259* (2013.01); *H01L 21/67276* (2013.01); *H01L 21/67288* (2013.01); *H01L 22/12* (2013.01); *H01L 22/20* (2013.01); *G03F 7/168* (2013.01)

(58) Field of Classification Search
None
See application file for complete search history.

(56) References Cited

U.S. PATENT DOCUMENTS

2017/0287704 A1* 10/2017 Amano ............. H01L 21/67253

FOREIGN PATENT DOCUMENTS

JP 2014-091105 A 5/2014

* cited by examiner

*Primary Examiner* — Jiong-Ping Lu
(74) *Attorney, Agent, or Firm* — Pearne & Gordon LLP (57) ABSTRACT A substrate processing apparatus includes a periphery removal unit configured to remove a peripheral portion of a film formed on a surface of a substrate; a profile acquisition unit configured to acquire a removal width profile indicating a relationship between a position in a circumferential direction of the substrate and a width of a portion of the substrate from which the film is removed; and a factor estimation unit configured to output factor information indicating a factor of an error in the width based on the removal width profile.

7 Claims, 8 Drawing Sheets

SUBSTRATE PROCESSING APPARATUS, ESTIMATION METHOD OF SUBSTRATE PROCESSING AND RECORDING MEDIUM

CROSS-REFERENCE TO RELATED APPLICATION

This application claims the benefit of Japanese Patent Application No. 2020-102961 filed on Jun. 15, 2020, the entire disclosure of which is incorporated herein by reference.

TECHNICAL FIELD

The exemplary embodiments described herein pertain generally to a substrate processing apparatus, an estimation method of a substrate processing and a recording medium.

BACKGROUND

Patent Document 1 discloses a coating film removing method including a process of removing a coating film into a ring shape by a predetermined width size by supplying a solvent from a solvent nozzle to a peripheral portion of the coating film formed on a surface of a substrate while rotating the substrate around an axis perpendicular to the substrate, a process of transferring the substrate to an inspection module for inspecting a state of the coating film by imaging the entire surface of the substrate, a process of detecting a removal region of the coating film based on the image data acquired by the inspection module, and a process of correcting a delivery position of a next substrate based on the detection result.

Patent Document 1: Japanese Patent Laid-open Publication No. 2014-091105

SUMMARY

A substrate processing apparatus includes a periphery removal unit configured to remove a peripheral portion of a film formed on a surface of a substrate; a profile acquisition unit configured to acquire a removal width profile indicating a relationship between a position in a circumferential direction of the substrate and a width of a portion of the substrate from which the film is removed; and a factor estimation unit configured to output factor information indicating a factor of an error in the width based on the removal width profile.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the following description, same parts or parts having same function will be assigned same reference numerals, and redundant description will be omitted.

Substrate Processing System

A substrate processing system 1 is a system configured to perform formation of a photosensitive film on a substrate, exposure of the photosensitive film and development of the photosensitive film. The substrate to be processed may be a semiconductor wafer, a glass substrate, a mask substrate, a flat panel display (FPD) or the like. The substrate may include a semiconductor wafer or the like on which a film has been formed by a processing in a previous stage.

Figure 1:
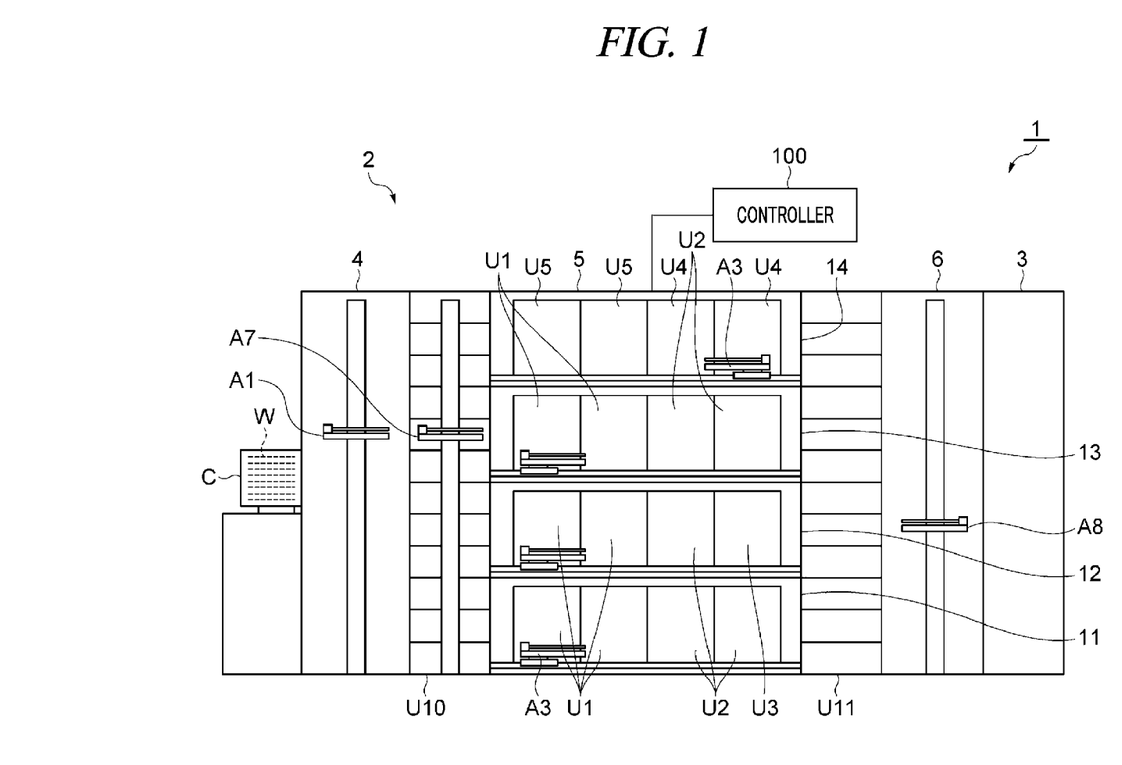
FIG. 1 illustrates an exemplary schematic configuration of a substrate processing system.

As shown in FIG. 1, the substrate processing system 1 includes a coating and developing apparatus 2 and an exposure apparatus 3. The exposure apparatus 3 is configured to perform an exposure processing of a resist film (photosensitive film) formed on a substrate W. The substrate W is, for example, circular in shape and has a position indicator (for example, a notch), which is a positional reference in a circumferential direction, at a peripheral portion. Specifically, the exposure apparatus 3 radiates an energy beam to an exposure target portion of the resist film by an immersion lithography or the like. The coating and developing apparatus 2 is configured to perform a processing of forming the resist film on the surface of the substrate W prior to the exposure processing by the exposure apparatus 3 and perform a developing processing on the resist film after the exposure processing.

Substrate Processing Apparatus

Hereinafter, a configuration of the coating and developing apparatus 2 will be described as an example of a substrate processing apparatus. The coating and developing apparatus 2 is equipped with a carrier block 4, a processing block 5, an interface block 6 and a controller 100.

The carrier block 4 is configured to carry the substrate W into/out of the coating and developing apparatus 2. For example, the carrier block 4 is configured to support a plurality of carriers C (accommodation units) for substrates W and incorporates therein a delivery arm A1. Each carrier C is configured to accommodate therein, for example, a plurality of circular substrates W. The delivery arm A1 is configured to take out the substrate W from the carrier C, deliver the substrate W to the processing block 5, receive the substrate W from the processing block 5 and return the substrate W back into the carrier C.

The processing block 5 includes a plurality of processing modules 11, 12, 13 and 14. The processing module 11 incorporates therein a plurality of coating units U1, a plurality of heat treatment units U2 and a transfer arm A3 configured to transfer the substrate W into these units.

The processing module 11 is configured to form a bottom film on the surface of the substrate W by the coating unit U1 and the heat treatment unit U2. The coating unit U1 is configured to coat a processing liquid for forming the bottom film on the substrate W. The heat treatment unit U2 is configured to perform various heat treatments required to form the bottom film. Each heat treatment unit U2 incorporates therein, for example, a heating plate and a cooling plate, and is configured to perform the heat treatment by heating the substrate W with the heating plate and cooling the heated substrate W with the cooling plate.

The processing module 12 (film forming unit) incorporates therein a plurality of coating units U1, a plurality of heat treatment units U2, a plurality of inspection units U3 and a transfer arm A3 configured to transfer the substrate W into these units. The processing module 12 is configured to form a resist film on the bottom film by the coating unit U1 and the heat treatment unit U2. The coating unit U1 is configured to coat a processing liquid for forming the resist film on the bottom film and thus form the film on the surface of the substrate W. Hereinafter, this film will be referred to as "pre-bake resist film". The heat treatment unit U2 is configured to perform various heat treatments required to form the resist film. As a result, the pre-bake resist film becomes the resist film.

The coating unit U1 may be configured to remove at least a part of the resist film. Removing at least the part of the resist film includes removing a part of the pre-bake resist film prior to the heat treatment by the heat treatment unit U2. For example, the coating unit U1 supplies a removal liquid onto a peripheral portion of the substrate W after forming the pre-bake resist film on the surface of the substrate W, and thus removes a peripheral portion of the pre-bake resist film.

The inspection unit U3 is configured to perform a processing for inspecting a state of a front surface Wa of the substrate W. For example, the inspection unit U3 acquires information indicating the state of the front surface Wa of the substrate W. The information indicating the state of the front surface Wa of the substrate W includes information about a width of a portion of the substrate W from which the resist film is removed (for example, a width in a diametrical direction of the substrate W).

The processing module 13 incorporates therein a plurality of coating units U1, a plurality of heat treatment units U2 and a transfer arm A3 configured to transfer the substrate W into these units. The processing module 13 is configured to form a top film on the resist film by the coating unit U1 and the heat treatment unit U2. The coating unit U1 of the processing module 13 is configured to coat a liquid for forming the top film on the resist film. The heat treatment unit U2 of the processing module 13 is configured to perform various heat treatments required to form the top film.

The processing module 14 incorporates therein a plurality of developing units U4, a plurality of heat treatment units U5 and a transfer arm A3 configured to transfer the substrate W into these units. The processing module 14 is configured to perform a developing processing on the exposed resist film by the developing unit U4 and the heat treatment unit U5. The developing unit U4 is configured to perform a developing processing on the resist film by coating a developing liquid on the front surface of the exposed substrate W and then washing the coated developing liquid with a rinse liquid. The heat treatment unit U5 is configured to perform various heat treatments required for the developing processing. Specific examples of these heat treatments may include a heat treatment before the developing processing (PEB: Post Exposure Bake), a heat treatment after the developing processing (PB: Post Bake).

Within the processing block 5, a shelf unit U10 is provided on the carrier block 4 side. The shelf unit U10 is partitioned into a plurality of cells arranged in a vertical direction. An elevation arm A7 is provided near the shelf unit 10. The elevation arm A7 is configured to move the substrate W up and down between the cells of the shelf unit U10.

Within the processing block 5, a shelf unit U11 is provided on the interface block 6 side. The shelf unit U11 is partitioned into a plurality of cells arranged in the vertical direction.

The interface block 6 is configured to deliver the substrate W to/from the exposure apparatus 3. For example, the interface block 6 incorporates therein a delivery arm A8 and is connected to the exposure apparatus 3. The delivery arm A8 is configured to deliver the substrate W placed in the shelf unit U11 to the exposure apparatus 3. The delivery arm A8 is also configured to receive the substrate W from the exposure apparatus 3 and return the received substrate W back into the shelf unit U11.

The controller 100 controls the components included in the coating and developing apparatus 2. Hereinafter, an exemplary sequence of a series of controls performed by the controller 100 on a single substrate W will be described. For example, the controller 100 controls the delivery arm A1 to transfer the substrate W within the carrier C to the shelf unit U10, and controls the elevation arm A7 to place this substrate W in the cell for the processing module 11.

Then, the controller 100 controls the transfer arm A3 to transfer the substrate W placed in the shelf unit U10 into the coating unit U1 and the heat treatment unit U2 within the processing module 11. Also, the controller 100 controls the coating unit U1 and the heat treatment unit U2 to form the bottom film on the surface of the substrate W. Thereafter, the controller 100 controls the transfer arm A3 to return the substrate W having the bottom film formed thereon back into the shelf unit U10. Then, the controller 100 controls the elevation arm A7 to place this substrate W in the cell for the processing module 12.

Subsequently, the controller 100 controls the transfer arm A3 to transfer the substrate W placed in the shelf unit U10 into the coating unit U1 and the heat treatment unit U2 within the processing module 12. Further, the controller 100 controls the coating unit U1 and the heat treatment unit U2 to form the resist film on the bottom film of the substrate W. For example, the controller 100 controls the coating unit U1 to form the pre-bake resist film on the bottom film of the substrate W and remove the peripheral portion of the pre-bake resist film and controls the heat treatment unit U2 to perform the heat treatment on the substrate W for turning the pre-bake resist film into the resist film.

Furthermore, the controller 100 controls the transfer arm A3 to transfer the substrate W into the inspection unit U3 and acquires the information indicating the state of the surface of the substrate W from the inspection unit U3. Then, the controller 100 controls the transfer arm A3 to return the substrate W back into the shelf unit U10 and controls the elevation arm A7 to place this substrate W in the cell for the processing module 13.

Thereafter, the controller 100 controls the transfer arm A3 to transfer the substrate W placed in the shelf unit U10 into each unit and controls the coating unit U1 and the heat treatment unit U2 to form the top film on the resist film of the substrate W. Subsequently, the controller 100 controls the transfer arm A3 to transfer the substrate W into the shelf unit U11.

Then, the controller 100 controls the delivery arm A8 to transfer the substrate W placed in the shelf unit U11 into the exposure apparatus 3. Thereafter, the controller 100 controls the delivery arm A8 to receive the exposed substrate W from the exposure apparatus 3 and place the substrate W in the cell for the processing module 14 within the shelf unit U11.

Subsequently, the controller 100 controls the transfer arm A3 to transfer the substrate W placed in the shelf unit U11 into the developing unit U4 and the heat treatment unit U5 inside the processing module 14 and controls the developing unit U4 and the heat treatment unit U5 to perform the developing processing on the resist film of the substrate W. Then, the controller 100 controls the transfer arm A3 to return the substrate W back into the shelf unit U10 and controls the elevation arm A7 and the delivery arm A1 to return this substrate back into the carrier C. Accordingly, the series of controls on the single substrate W are ended.

Coating Unit

Figure 2:
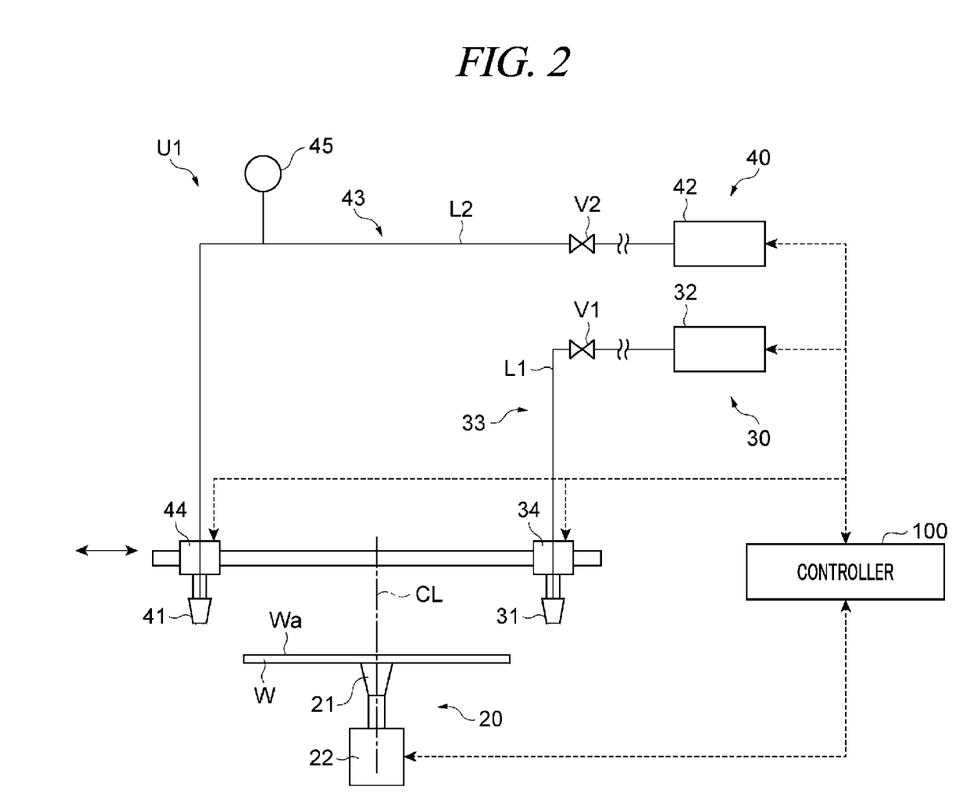
FIG. 2 illustrates an exemplary schematic configuration of a coating unit.

Hereinafter, an exemplary configuration of the coating unit U1 in the processing module 12 will be described in detail. As described above, the coating unit U1 supplies the processing liquid for forming the resist film onto the front surface Wa of the substrate W to form the pre-bake resist film. Also, the coating unit U1 (periphery removal unit) supplies the removal liquid to the peripheral portion of the substrate W after forming the pre-bake resist film on the front surface Wa of the substrate W, and thus removes the peripheral portion of the pre-bake resist film.

As shown in FIG. 2, the coating unit U1 is equipped with a rotating holder 20, a processing liquid supply 30 and a removal liquid supply 40. The rotating holder 20 is configured to hold and rotate the substrate W. For example, the rotating holder 20 is equipped with a holder 21 and a rotation driving unit 22. The holder 21 is configured to support the substrate W, which is horizontally placed thereon with the front surface Wa facing upwards, and hold the substrate W by attraction (for example, vacuum attraction). The rotation driving unit 22 is configured to rotate the holder 21 around a vertical rotation center CL with, for example, an electric motor as a power source. Accordingly, the substrate W is rotated.

The processing liquid supply 30 is configured to supply the processing liquid for forming the resist film onto the front surface Wa of the substrate W. For example, the processing liquid supply 30 is equipped with a nozzle 31, a liquid source 32, a liquid sending unit 33 and a nozzle moving unit 34. The nozzle 31 is configured to discharge the processing liquid onto the front surface Wa of the substrate W. The liquid source 32 is configured to store therein the processing liquid and force-feed the processing liquid to the nozzle 31. The liquid sending unit 33 is configured to guide the processing liquid from the liquid source 32 to the nozzle 31. For example, the liquid sending unit 33 has a liquid sending line L1 and a valve V1. The liquid sending line L1 connects the liquid source 32 and the nozzle 31. The valve V1 is, for example, an air operation valve, and opens and closes a flow path in the liquid sending line L1. The nozzle moving unit 34 is configured to move the nozzle 31 between the rotation center CL and outside the substrate W by using a power source such as an electric motor.

The removal liquid supply 40 is configured to supply the removal liquid to the front surface Wa of the substrate W. The removal liquid is a solvent configured to remove (dissolve) the pre-bake resist film formed by the processing liquid supplied from the processing liquid supply 30. Specific examples of the removal liquid may include organic solvents such as thinner. For example, the removal liquid supply 40 is equipped with a nozzle 41, a liquid source 42, a liquid sending unit 43, a flow rate sensor 45 and a nozzle moving unit 44.

The nozzle 41 is configured to discharge the removal liquid toward the peripheral portion of the substrate W held and rotated by the rotating holder 20. The nozzle 41 is configured to discharge the removal liquid toward the front surface Wa of the substrate W being rotated by the rotating holder 20. The liquid source 42 is configured to store therein the removal liquid and force-feed the removal liquid to the nozzle 41. The liquid sending unit 43 is configured to guide the removal liquid from the liquid source 42 to the nozzle 41. For example, the liquid sending unit 33 has a liquid sending line L2 and a valve V2. The liquid sending line L2 connects the liquid source 42 and the nozzle 41. The valve V2 is, for example, an air operation valve, and opens and closes a flow path in the liquid sending line L2. The flow rate sensor 45 is configured to detect a flow rate (flowing amount per unit time) of the removal liquid in the liquid sending line L2. The nozzle moving unit 44 is configured to move the nozzle 41 between above the peripheral portion of the substrate W and outside the substrate W by using a power source such as an electric motor.

Inspection Unit

Figure 3:
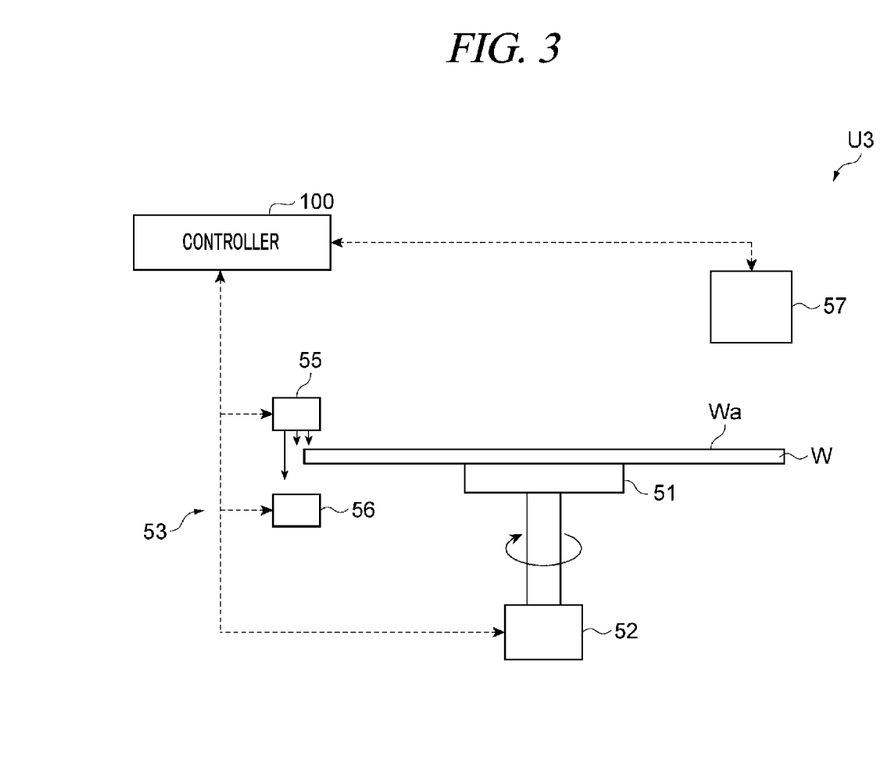
FIG. 3 illustrates an exemplary schematic configuration of an inspection unit.

Hereinafter, an exemplary configuration of the inspection unit U3 will be described in detail. The inspection unit U3 is configured to acquire image data as surface information indicating the state of the front surface Wa of the substrate W by imaging the front surface Wa. As shown in FIG. 3, the inspection unit U3 is equipped with a holder 51, a rotation driving unit 52, a position indicator detector 53 and an imaging unit 57.

The holder 51 is configured to support the substrate W, which is horizontally placed thereon with the front surface Wa facing upwards, and hold the substrate W by attraction (for example, vacuum attraction). The rotation driving unit 52 is configured to rotate the holder 51 around a vertical rotation center with, for example, an electric motor as a power source. Accordingly, the substrate W is rotated.

The position indicator detector 53 is configured to detect a notch of the substrate W. For example, the position indicator detector 53 is equipped with a light projecting unit 55 and a light receiving unit 56. The light projecting unit 55 is configured to project light toward the peripheral portion of the substrate W being rotated. For example, the light projecting unit 55 is located above the peripheral portion of the substrate W and projects light downwards. The light receiving unit 56 is configured to receive the light projected by the light projecting unit 55. For example, the light receiving unit 56 is located under the peripheral portion of the substrate W so as to face the light projecting unit 55.

The imaging unit 57 is a camera configured to image at least the peripheral portion of the front surface Wa of the substrate W. For example, the imaging unit 57 is configured to image the peripheral portion of the front surface Wa of the substrate W on which the resist film is not formed (the pre-bake resist film is removed). For example, the imaging unit 57 is located above the peripheral portion of the substrate W held by the holder 51 and faces downwards.

Controller

The coating unit U1 and the inspection unit U3 are controlled by the controller 100. A sequence of controlling the coating unit U1 and the inspection unit U3 by the controller 100 includes removing the peripheral portion of the resist film formed on the front surface Wa of the substrate W by the coating unit U1, acquiring, from the inspection unit U3, a removal width profile indicating a relationship between the position in the circumferential direction of the substrate W and a width of a portion of the substrate W from which the resist film has been removed (hereinafter, referred to as "removal width"), and outputting factor information indicating a factor of an error in the removal width based on the removal width profile. The error refers to a deviation from a predetermined target value.

The removal width may have an error caused by various factors. It takes some time to specify which factor causes the error just based on an evaluation result of the error. Meanwhile, the removal width profile indicating the relationship between the position in the circumferential direction of the substrate W and the removal width tends to show different features depending on the error factors. For this reason, it is possible to output accurate factor information based on the removal width profile.

Figure 4:
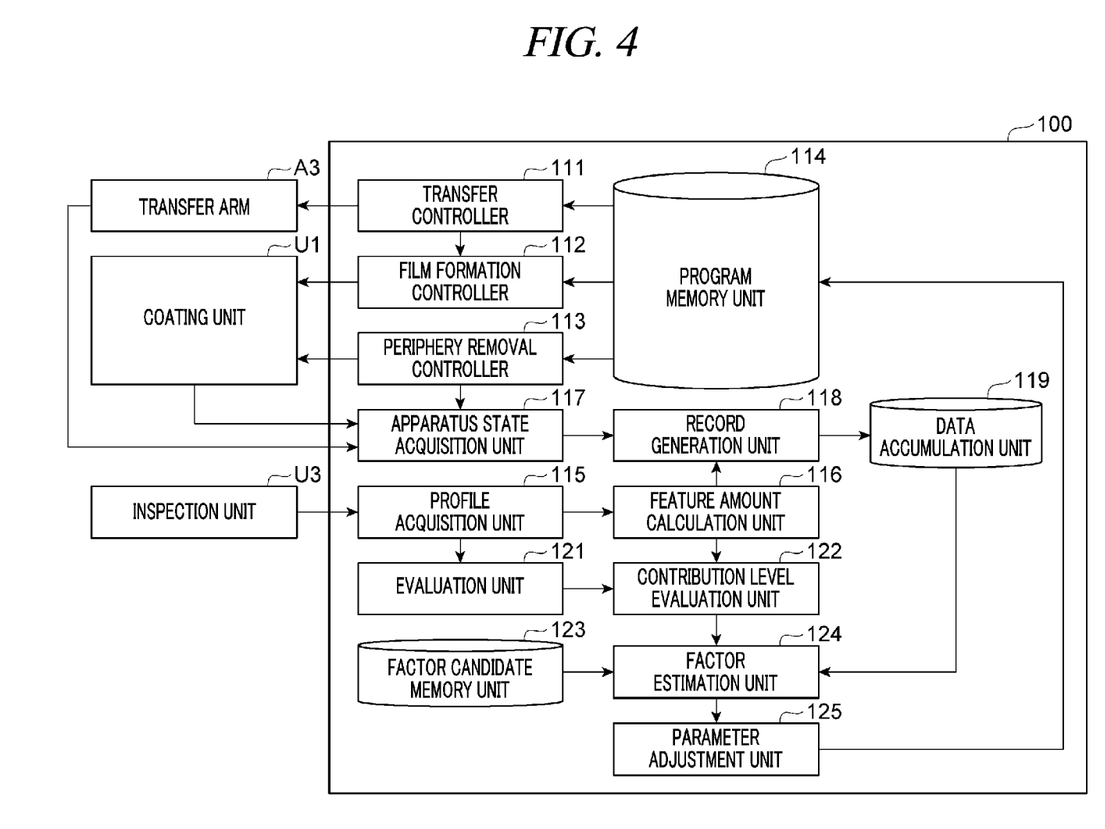
FIG. 4 illustrates an exemplary functional configuration of a controller.

Hereinafter, a specific example of the configuration of the controller 100 for controlling the coating unit U1 and the inspection unit U3 will be described with reference to FIG. 4. As shown in FIG. 4, the controller 100 is equipped with, as functional components (hereinafter, referred to as "functional blocks"), a transfer controller 111, a film formation controller 112, a periphery removal controller 113, a program memory unit 114, a profile acquisition unit 115, a feature amount calculation unit 116, a factor candidate memory unit 123, an apparatus state acquisition unit 117, a record generation unit 118 and a data accumulation unit 119.

The transfer controller 111 is configured to control the transfer arm A3 to transfer the substrate W based on an operation program stored in the program memory unit 114. The operation program for the transfer arm A3 includes time-series instructions defined by at least one control parameter. Specific examples of the at least one control parameter may include a transfer target position of the substrate W and a transfer speed to the transfer target position.

The film formation controller 112 is configured to control the coating unit U1 to form the pre-bake resist film on the surface of the substrate W based on an operation program stored in the program memory unit 114. The periphery removal controller 113 is configured to control the coating unit U1 to remove the peripheral portion of the pre-bake resist film based on an operation program stored in the program memory unit 114.

The operation program for the coating unit U1 includes time-series instructions defined by at least one control parameter. Specific examples of the at least one control parameter may include a discharge rate of the processing liquid for forming the resist film from the nozzle 31 (discharge amount per unit time), a position of the nozzle 41 when the removal liquid is discharged (for example, distance from the rotation center CL to the center of the nozzle 41) and a discharge rate of the removal liquid from the nozzle 41 (discharge amount per unit time). Instead of the discharge rate of the processing liquid from the nozzle 31, an opening degree of the valve V1 may be determined, or instead of the discharge rate of the removal liquid from the nozzle 41, an opening degree of the valve V2 may be determined.

The profile acquisition unit 115 is configured to acquire, from the inspection unit U3, the removal width profile indicating the relationship between the position in the circumferential direction of the substrate W and the width of the portion of the substrate W from which the resist film is removed (the removal width). The position in the circumferential direction of the substrate W refers to a position based on the position indicator detected by the position indicator detector 53 and is indicated by, for example, an angle of a central circumference of the substrate W. The width of the portion from which the resist film is removed refers to, for example, the width in the diametrical direction of the substrate W. The removal width profile may be sequential data that discretely show the relationship between the position in the circumferential direction of the substrate W and the removal width, or may be functional data that continuously show the relationship between the position in the circumferential direction of the substrate W and the removal width.

The feature amount calculation unit 116 is configured to calculate a plurality of kinds of feature amounts corresponding to at least one error factor based on the removal width profile. The plurality of kinds of feature amounts include an evaluation value of the removal width, an evaluation value of an eccentricity of a periphery of the resist film with respect to a periphery of the substrate W, an evaluation value of the roundness of the periphery of the resist film and an evaluation value of the roughness of the periphery of the resist film. The evaluation value of the removal width refers to, for example, a value indicating the overall tendency for the removal width profile. Specific examples of these evaluation values may include an average value and a median value.

The feature amount calculation unit 116 calculates an approximation function of an outer appearance of the resist film by using the center of the substrate W as a reference point based on the removal width profile, and calculates the evaluation value of the eccentricity, the evaluation value of the roundness and the evaluation value of the roughness based on the corresponding approximation function.

Each of the plurality of kinds of feature amounts calculated by the feature amount calculation unit 116 corresponds to at least one error factor in the factor candidate memory unit 123. The plurality of kinds of feature amounts may include a composite feature amount corresponding to a plurality of kinds of error factors.

For example, the evaluation value of the width is matched to at least a position deviation of the nozzle 41 and a change in the discharge rate of the removal liquid from the nozzle 41 in the factor candidate memory unit 123. Herein, the change refers to a long-term change occurring over a long period of time, as compared to a processing period for a single substrate W.

The evaluation value of the eccentricity is matched to at least a position deviation of the substrate W in the rotating holder 20 in the factor candidate memory unit 123, the evaluation value of the roundness is matched to at least a distortion of the substrate W and a distortion of the rotating holder 20, and the evaluation value of the roughness is matched to at least a liquid scattering of the removal liquid and a variation in the discharge rate of the removal liquid from the nozzle 41. Herein, the variation refers to a variation occurring within the processing period for the single substrate W. Each of the evaluation value of the width, the evaluation value of the roundness and the evaluation value of the roughness, which are matched to at least two error factors, corresponds to the composite feature amount.

The apparatus state acquisition unit 117 is configured to acquire information indicating an operational state of apparatuses, such as the transfer arm A3 and the coating unit U1, involved in at least the formation of the resist film. For example, the apparatus state acquisition unit 117 acquires a placement position of the substrate W placed in the coating unit U1 by the transfer arm A3 (a position of the substrate W in the rotating holder 20), a placement position of the nozzle 41 when the pre-bake resist film is removed, a discharge rate of the removal liquid from the nozzle 41 when the pre-bake resist film is removed (for example, a flow rate detected by the flow rate sensor 45), and the like.

The record generation unit 118 is configured to generate a record including a calculation result of one feature amount and a state of the coating unit U1 corresponding to the feature amount, and accumulates the generated record in the data accumulation unit 119. Herein, the term "corresponding to" means corresponding to the same substrate W. The state of the coating unit U1 corresponding to the feature amount refers to a state of the coating unit U1 while the pre-bake resist film is removed from the substrate W for which the corresponding feature amount is calculated.

The state of the coating unit U1 includes at least a position of the substrate W in the rotating holder 20 (a position of the center of the substrate W with respect to the rotation center CL of the holder 21), a position of the nozzle 41 when the removal liquid is discharged, a discharge rate of the removal liquid from the nozzle 41 and a variation range in the discharge rate of the removal liquid from the nozzle 41. Herein, the variation range refers to a variation range occurring within the processing period for the single substrate W. The data accumulation unit 119 is configured to accumulate therein the record generated by the record generation unit 118.

The controller 100 is further equipped with an evaluation unit 121, a contribution level evaluation unit 122 and a factor estimation unit 124. The evaluation unit 121 is configured to evaluate the removal width based on the removal width profile. The evaluation result of the removal width by the evaluation unit 121 may include a plurality of kinds of evaluation values. For example, the evaluation result of the removal width by the evaluation unit 121 may include a maximum value and a minimum value of the removal width in the removal width profile, or may include a maximum value, an average value and a minimum value of the removal width in the removal width profile.

The contribution level evaluation unit 122 is configured to evaluate contribution levels of the plurality of kinds of feature amounts to the error based on the calculation result of the plurality of kinds of feature amounts. The contribution level refers to a value indicating the degree of influence on the error. The contribution levels are calculated by any known statistical calculation method.

The factor estimation unit 124 is configured to output factor information indicating the factor of the error in the removal width based on the removal width profile. The "output" includes display on a display device 196 to be described later, transmission of the factor information to another apparatus, and the like. The output also includes output of the factor information to a functional block, such as a parameter adjustment unit 125 to be described later, configured to perform a further processing based on the factor information.

The factor estimation unit 124 may output the factor information based on the calculation result of the plurality of kinds of feature amounts. The factor estimation unit 124 may output the factor information based on the contribution levels of the plurality of kinds of feature amounts to the error. The factor estimation unit 124 may output the factor information based on at least one error factor matched to at least the feature amount having the highest contribution level among the plurality of kinds of error factors. For example, the factor estimation unit 124 outputs the factor information indicating the error factor matched to at least the feature amount having the highest contribution level.

The factor estimation unit 124 may output the factor information indicating the contribution level and at least one error factor matched thereto with respect to each of the plurality of kinds of feature amounts. According to this factor information, it is possible to indicate the error factor matched to the feature amount having the highest contribution level and also possible to indicate how much higher the contribution level of the error factor is than that of other error factors.

Also, the factor estimation unit 124 may output the factor information indicating which contribution level is highest among the plurality of kinds of feature amounts. If a user already knows which error factor is matched to each of the plurality of kinds of feature amounts, the error factor may be indicated by indicating which contribution level is highest among the plurality of kinds of feature amounts.

The factor estimation unit 124 may output the factor information indicating the contribution level of each of the plurality of kinds of feature amounts. According to this factor information, it is possible to indicate the feature amount having the highest contribution level and also possible to indicate how much higher the contribution level of the feature amount is than that of other feature amounts.

If the feature amount having the highest contribution level is the composite feature amount, the factor estimation unit 124 may output the factor information based on the plurality of kinds of error factors matched to the composite feature amount and the state of the coating unit U1. Herein, the state of the coating unit U1 refers to the state of the coating unit U1 corresponding to the composite feature amount. Herein, the term "corresponding to" means corresponding to the same substrate W. The state of the coating unit U1 corresponding to the composite feature amount refers to the state of the coating unit U1 while the pre-bake resist film is being removed from the substrate W for which the composite feature amount is calculated.

For example, if the feature amount having the highest contribution level is the composite feature amount, the factor estimation unit 124 may evaluate a correlation level between each of the plurality of kinds of error factors and the composite feature amount based on the records accumulated in the data accumulation unit 119, and output the factor information based on the evaluation result of the correlation level.

The factor estimation unit 124 may evaluate the correlation level between each of the plurality of kinds of error factors and the composite feature amount based on a predetermined number of a series of records including the latest record from among the records accumulated in the data accumulation unit 119. For example, the factor estimation unit 124 outputs the factor information indicating the error factor having a relatively high correlation level with respect to the composite feature amount.

For example, if the feature amount having the highest contribution level is the evaluation value of the width, the factor estimation unit 124 evaluates the correlation level (hereinafter, referred to as "first correlation level") between the position of the nozzle 41 and the evaluation value of the width and the correlation level (hereinafter, referred to as "second correlation level") between the discharge rate of the removal liquid from the nozzle 41 and the evaluation value based on the predetermined number of a series of records. For example, the first correlation level indicates the correlation level between the position deviation of the nozzle 41 and the evaluation value of the width. For example, the second correlation level indicates the correlation level between the change in the discharge rate of the removal liquid from the nozzle 41 and the evaluation value of the width.

If the first correlation level is higher than the second correlation level, the factor estimation unit 124 outputs the factor information indicating the position deviation of the nozzle 41 as the error factor having the highest probability. If the second correlation level is higher than the first correlation level, the factor estimation unit 124 outputs the factor information indicating the change in the discharge rate of the removal liquid from the nozzle 41 as the error factor having the highest probability.

If the feature amount having the highest contribution level is the evaluation value of the roughness, the factor estimation unit 124 evaluates the correlation level (hereinafter, referred to as "third correlation level") between the variation range in the discharge rate of the removal liquid from the nozzle 41 and the evaluation value of the roughness based on the predetermined number of a series of records. If the third correlation level exceeds a predetermined level, the factor estimation unit 124 outputs the factor information indicating the variation in the discharge rate of the removal liquid as the error factor having the highest probability. If the third correlation level is lower than the predetermined level, the factor estimation unit 124 outputs the factor information indicating the liquid scattering of the removal liquid as the error factor having the highest probability.

The factor estimation unit 124 may output the factor information when the evaluation result of the removal width by the evaluation unit 121 is out of a predetermined range, and may not output the factor information when the evaluation result of the removal width by the evaluation unit 121 is within the predetermined range. For example, if the maximum value of the removal width exceeds the upper limit of the predetermined range or if the minimum value of the removal width is lower than the lower limit of the predetermined range, the factor estimation unit 124 may output the factor information. If both the maximum value and the minimum value of the removal width are within the predetermined range, the factor estimation unit 124 may not output the factor information.

In response to this, when the evaluation result of the removal width by the evaluation unit 121 is out of the predetermined range, the contribution level evaluation unit 122 may calculate the contribution level, and when the evaluation result of the removal width by the evaluation unit 121 is within the predetermined range, the contribution level evaluation unit 122 may not calculate the contribution level. For example, if the maximum value of the removal width exceeds the upper limit of the predetermined range or if the minimum value of the removal width is lower than the lower limit of the predetermined range, the contribution level evaluation unit 122 may calculate the contribution level. If both the maximum value and the minimum value of the removal width are within the predetermined range, the contribution level evaluation unit 122 may not calculate the contribution level.

The controller 100 may be further equipped with the parameter adjustment unit 125. The parameter adjustment unit 125 is configured to adjust, based on the factor information, at least one control parameter in the operation program stored in the program memory unit 114. For example, the parameter adjustment unit 125 changes at least one control parameter to alleviate the error factor indicated by the factor information.

For example, if the factor information indicates the position deviation of the nozzle 41 as the error factor having the highest probability, the parameter adjustment unit 125 changes the position of the nozzle 41 when the removal liquid is discharged. If the factor information indicates the change in the discharge rate of the removal liquid from the nozzle 41 as the error factor having the highest probability, the parameter adjustment unit 125 changes the discharge rate of the removal liquid from the nozzle 41. If the factor information indicates the position deviation of the substrate W in the rotating holder 20 as the error factor having the highest probability, the parameter adjustment unit 125 changes a placement position of the substrate W placed in the coating unit U1 by the transfer arm A3.

Figure 5:
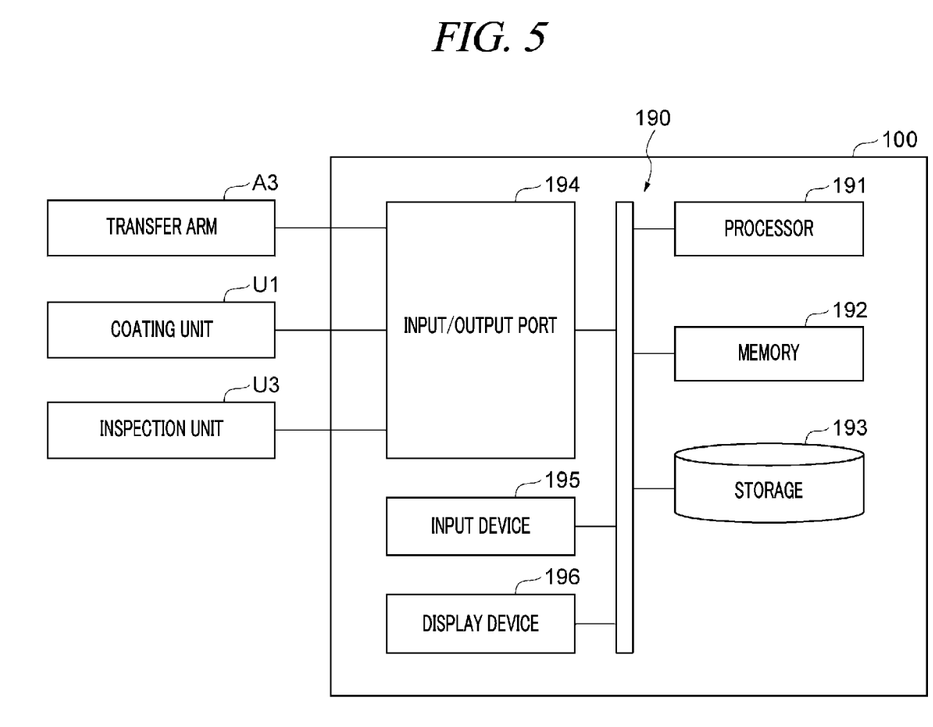
FIG. 5 illustrates an exemplary hardware configuration of the controller.

FIG. 5 is a block diagram illustrating an exemplary hardware configuration of the controller 100. The controller 100 is composed of one or more control computers. As shown in FIG. 5, the controller 100 has a circuit 190. The circuit 190 includes at least one processor 191, a memory 192, a storage 193, an input/output port 194, an input device 195 and a display device 196. The storage 193 has a computer-readable recoding medium such as a hard disc or the like. The storage 193 stores therein a program that enables the controller 100 to perform removing the peripheral portion of the resist film formed on the front surface Wa of the substrate W by the coating unit U1, acquiring, from the inspection unit U3, the removal width profile indicating the relationship between the position in the circumferential direction of the substrate W and the removal width, and outputting the factor information indicating the factor of the error in the removal width based on the removal width profile. For example, the storage 193 stores therein programs for constituting the respective functional blocks in the controller 100.

The memory 192 temporarily stores therein the programs loaded form the recording medium of the storage 193 and operation results by the processor 191. The processor 191 executes the programs in cooperation with the memory 192 and thus constitutes the respective functional modules. The input/output port 194 inputs and outputs the electric signals among the transfer arm A3, the coating unit U1 and the inspection unit U3 in response to the instruction from the processor 191. The input device 195 and the display device 196 function as user interfaces of the controller 100. The input device 195 is, for example, a keyboard or the like and acquires input information from the user. The display device 196 is, for example, a liquid crystal monitor or the like and is used to display information about the user. The display device 196 is used to display, for example, the factor information. The input device 195 and the display device 196 may be integrated as a so-called touch panel.

Control Sequence

Hereinafter, an exemplary control sequence of the coating and developing apparatus 2 by the controller 100 will be described as an example of an estimation method of a substrate processing. The overall sequence is the same as described above in section [Substrate processing apparatus]. The control sequence of the coating and developing apparatus 2 by the controller 100 further includes a film formation control sequence, an acquisition sequence of the removal profile and an output sequence of the factor information in addition to the above-described overall sequence.

The film formation control sequence is a control sequence of controlling the coating unit U1 to form the pre-bake resist film and remove the peripheral portion of the pre-bake resist film by the controller 100. The acquisition sequence of the removal profile is a control sequence of controlling the inspection unit U3 to measure the removal widths from at least two points in the circumferential direction of the substrate W by the controller 100 to acquire the removal profile. The output sequence of the factor information is a control sequence of outputting the factor information indicating the factor of the error in the removal width by the controller 100 based on the removal profile. Hereinafter, the film formation control sequence, the acquisition sequence of the removal profile and the output sequence of the factor information will be described in detail.

Film Formation Control Sequence

Figure 6:
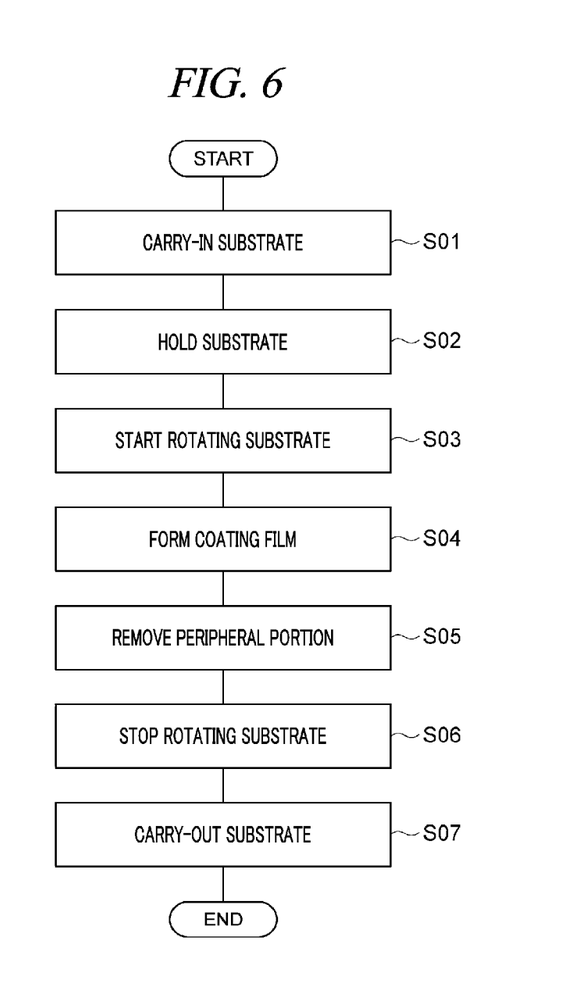
FIG. 6 is a flowchart showing an exemplary film formation control sequence.

As shown in FIG. 6, the controller 100 sequentially performs processes S01, S02, S03, S04, S05, S06 and S07. In the process S01, the transfer controller 111 controls the transfer arm A3 to place the substrate W in the coating unit U1 based on the operation program stored in the program memory unit 114. Here, the apparatus state acquisition unit 117 acquires information about the placement position of the substrate W placed by the transfer arm A3. In the process S02, the film formation controller 112 holds the substrate W, which is placed in the coating unit U1 by the transfer arm A3, on the holder 21. In the process S03, the film formation controller 112 controls the rotation driving unit 22 to start rotating the holder 21 and the substrate W.

In the process S04, the film formation controller 112 controls the coating unit U1 to form the pre-bake resist film on the front surface Wa of the substrate W based on the operation program stored in the program memory unit 114. For example, the film formation controller 112 controls the nozzle moving unit 34 to place the nozzle 31 above the rotation center CL of the substrate W and controls the liquid sending unit 33 to discharge the processing liquid from the nozzle 31 for a predetermined period of time. Accordingly, the liquid film of the processing liquid is formed on the front surface Wa. Then, the film formation controller 112 controls the liquid sending unit 33 to stop discharging the processing liquid from the nozzle 31 and controls the nozzle moving unit 34 to retreat the nozzle 31 from the substrate W. After the discharging of the processing liquid is stopped, the film formation controller 112 controls the rotation driving unit 22 to continue rotating the substrate W for a predetermined period of time. Accordingly, the liquid film is dried to form the pre-bake resist film.

In the process S05, the periphery removal controller 113 controls the coating unit U1 to remove the peripheral portion of the pre-bake resist film based on the operation program stored in the program memory unit 114. For example, the periphery removal controller 113 controls the nozzle moving unit 44 to place the nozzle 41 above the peripheral portion of the substrate W and controls the liquid sending unit 43 to continue discharging the removal liquid from the nozzle 41 for a predetermined period of time. Accordingly, the peripheral portion of the pre-bake resist film is removed.

When the pre-bake resist film is removed, the apparatus state acquisition unit 117 acquires the placement position of the nozzle 41 placed by the nozzle moving unit 44 and the discharge rate of the removal liquid from the nozzle 41 (for example, the detection value detected by the flow rate sensor 45). Then, the periphery removal controller 113 controls the liquid sending unit 43 to stop discharging the removal liquid from the nozzle 41 and controls the nozzle moving unit 44 to retreat the nozzle 41 from the substrate W.

In the process S06, the periphery removal controller 113 controls the rotation driving unit 22 to stop rotating the holder 21 and the substrate W. In the process S07, the periphery removal controller 113 releases the substrate W from the holder 21, and the transfer controller 111 controls the transfer arm A3 to carry the substrate W out of the coating unit U1. The film formation control sequence is completed as described above.

Removal Profile Acquisition Sequence

Figure 7:
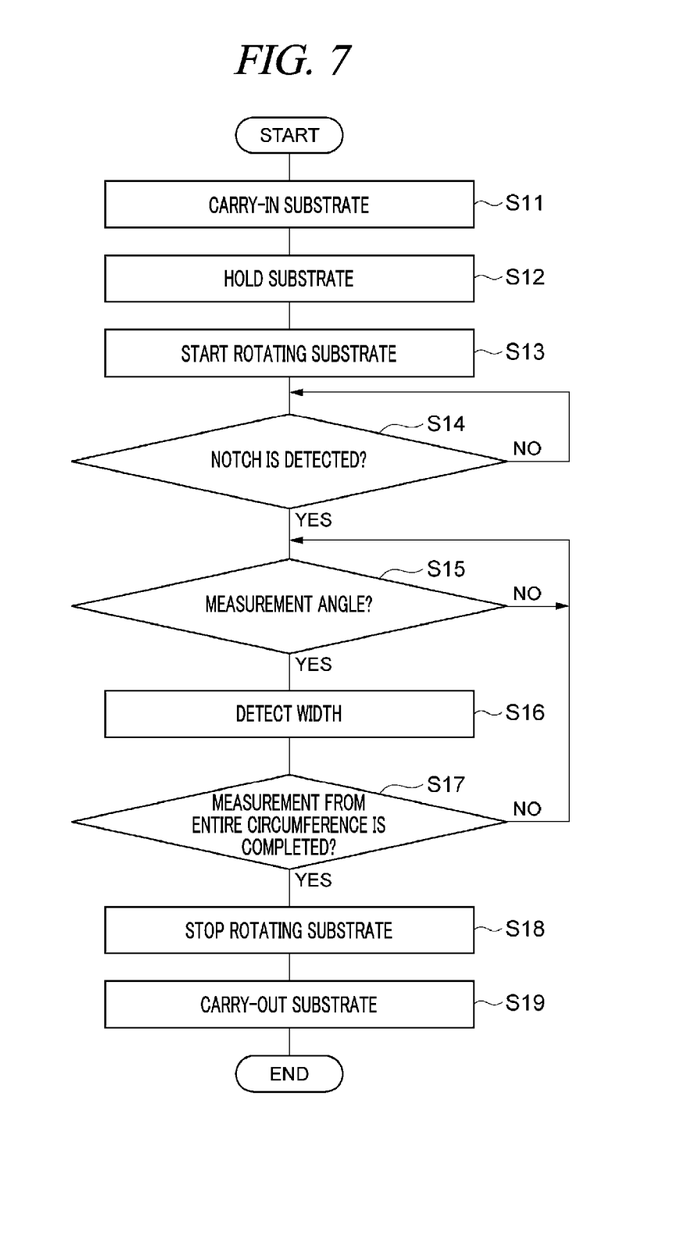
FIG. 7 is a flowchart showing an exemplary acquisition sequence of a removal profile.

As shown in FIG. 7, the controller 100 first performs processes S11, S12, S13, S14, S15, S16 and S17. In the process S11, the transfer controller 111 controls the transfer arm A3 to place the substrate W in the inspection unit U3 based on the operation program stored in the program memory unit 114. In the process S12, the profile acquisition unit 115 holds the substrate W, which is placed in the inspection unit U3 by the transfer arm A3, on the holder 51. In the process S13, the profile acquisition unit 115 controls the rotation driving unit 52 to start rotating the holder 51 and the substrate W.

In the process S14, the profile acquisition unit 115 waits for the detection of the position indicator (for example, the notch) by the position indicator detector 53. In the process S15, the profile acquisition unit 115 waits until the rotation angle after the detection of the notch reaches a predetermined measurement angle. In the process S16, the profile acquisition unit 115 allows the imaging unit 57 to image the peripheral portion of the substrate W, calculates the removal width based on the acquired image, and stores the removal width to be matched to the current measurement angle. In the process S17, the profile acquisition unit 115 checks whether or not the removal width is completely measured from the entire circumference of the substrate W. For example, the profile acquisition unit 115 checks whether or not the removal widths are completely measured from all of predetermined measurement points in the periphery of the substrate W.

If it is determined in the process S17 that the removal width is not completely measured from a part of the peripheral portion of the substrate W, the controller 100 returns the processing to the process S15. Then, the acquisition of the removal width corresponding to the predetermined measurement angle is repeated until the removal widths are completely measured from the entire circumference.

If it is determined in the process S17 that the removal width is completely measured from the entire circumference of the substrate W, the controller 100 performs processes S18 and S19. In the process S18, the profile acquisition unit 115 allows the rotation driving unit 52 to stop rotating the holder 51 and the substrate W. In the process S19, the profile acquisition unit 115 releases the substrate W from the holder 51, and the transfer controller 111 controls the transfer arm A3 to carry the substrate W out of the inspection unit U3. The removal profile acquisition sequence is completed as described above.

Output Sequence of Factor Information

Figure 8:
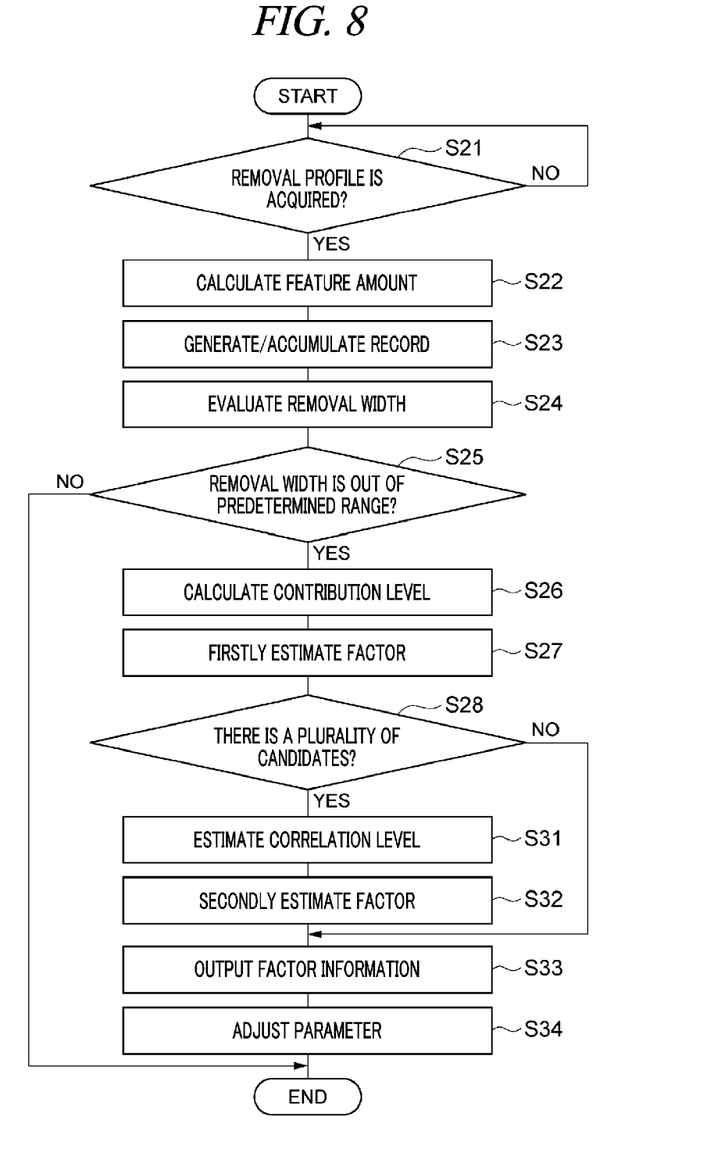
FIG. 8 is a flowchart showing an exemplary output sequence of factor information.

As shown in FIG. 8, the controller 100 first performs processes S21, S22, S23, S24 and S25. In the process S21, the feature amount calculation unit 116 waits until the acquisition of the removal profile by the profile acquisition unit 115 is completed. In the process S22, the feature amount calculation unit 116 calculates the above-described plurality of kinds of feature amounts based on the removal width profile. In the process S23, the record generation unit 118 generates the record including the calculation result of the feature amount and the state of the coating unit U1 corresponding to the feature amount, and accumulates the generated record in the data accumulation unit 119. The record generation unit 118 acquires, from the apparatus state acquisition unit 117, the information indicating the state of the coating unit U1 corresponding to the feature amount.

In the process S24, the evaluation unit 121 evaluates the removal width based on the removal width profile. For example, the evaluation unit 121 evaluates the maximum value and the minimum value of the removal width in the removal width profile. In the process S25, the contribution level evaluation unit 122 checks whether or not the evaluation result of the removal width by the evaluation unit 121 is out of the predetermined range. For example, if the maximum value of the removal width exceeds the upper limit of the predetermined range, the contribution level evaluation unit 122 determines that the evaluation result of the removal width is out of the predetermined range, and if the minimum value of the removal width is lower than the lower limit of the predetermined range, the level evaluation unit 122 determines that the evaluation result of the removal width is out of the predetermined range.

If it is determined in the process S25 that the evaluation result of the removal width is out of the predetermined range, the controller 100 performs processes S26, S27 and S28. In the process S26, the contribution level evaluation unit 122 evaluates the contribution levels of the plurality of kinds of feature amounts to the error based on the calculation result of the plurality of kinds of feature amounts. In the process S27, the factor estimation unit 124 derives the error factor matched to the feature amount having the highest contribution level based on the factor candidate memory unit 123. In the process S28, the factor estimation unit 124 checks whether or not the feature amount having the highest contribution level is the above-described composite feature amount.

If it is determined in the process S28 that the feature amount having the highest contribution level is the composite feature amount, the controller 100 performs processes S31, S32 and S33. In the process S31, the factor estimation unit 124 evaluates the correlation level between each of the plurality of kinds of error factors and the composite feature amount based on the records accumulated in the data accumulation unit 119 when the feature amount having the highest contribution level is the composite feature amount. In the process S32, the factor estimation unit 124 selects the error factor having the highest correlation level with respect to the composite feature amount among the plurality of error factors matched to the composite feature amount. In the process S33, the factor estimation unit 124 outputs the factor information indicating the error factor selected in the process S32.

If it is determined in the process S28 that the feature amount having the highest contribution level is not the composite feature amount, the controller 100 does not perform the processes S31 and S32, but performs the process S33. In this case, the factor estimation unit 124 outputs the factor information indicating the error factor derived in the process S27.

Then, the controller 100 performs a process S34. In the process S34, the parameter adjustment unit 125 adjusts, based on the factor information, at least one control parameter in the operation program stored in the program memory unit 114.

If it is determined in the process S25 that the evaluation result of the removal width is within the predetermined range, the contribution level evaluation unit 122 does not calculate the contribution levels, the factor estimation unit 124 does not output the factor information, and the parameter adjustment unit 125 does not adjust the control parameters. The output sequence of the factor information is completed as described above.

Effect of the Present Exemplary Embodiment

As described above, the coating and developing apparatus 2 (substrate processing apparatus) includes the coating unit U1 (periphery removal unit) configured to remove the peripheral portion of the film formed on the front surface Wa of the substrate W, the profile acquisition unit 115 configured to acquire the removal width profile indicating the relationship between the position in the circumferential direction of the substrate W and the width of the portion of the substrate W from which the film is removed, and the factor estimation unit 124 configured to output the factor information indicating the factor of the error in the width based on the removal width profile.

The removal width may have the error caused by various factors. It takes some time to specify which factor causes the error just based on the error evaluation result. In this regard, the removal width profile indicating the relationship between the position in the circumferential direction of the substrate W and the removal width tends to show different features depending on the error factor. For this reason, it is possible to output the accurate factor information based on the removal width profile. Also, it is possible to rapidly specify and adjust the factor of the error based on the accurate factor information. Therefore, the coating and developing apparatus 2 is effective in rapidly adjusting the removal width.

The coating and developing apparatus 2 may further include the evaluation unit 121 configured to evaluate the width based on the removal width profile, and if the evaluation result of the width is out of a predetermined range, the factor estimation unit 124 may output the factor information. In this case, the factor information is output only when the evaluation result of the error exceeds the predetermined level, and, thus, it is possible to alleviate the information processing loads in the coating and developing apparatus 2.

The coating and developing apparatus 2 may further include the feature amount calculation unit 116 configured to calculate the multiple kinds of feature amounts matched to at least one error factor based on the removal width profile, and the factor estimation unit 124 may output the factor information based on the calculation result of the multiple kinds of feature amounts. In this case, it is possible to more easily output the factor information.

The multiple kinds of feature amounts may include the evaluation value of the width, the evaluation value of the eccentricity of the periphery of the film with respect to the periphery of the substrate, the evaluation value of the roundness of the periphery of the film and the evaluation value of the roughness of the periphery of the film. In this case, it is possible to output more useful factor information.

The coating unit U1 further includes the rotating holder 20 configured to hold and rotate the substrate W and the nozzle 41 configured to discharge the removal liquid for removing the film toward the peripheral portion of the substrate W held and rotated by the rotating holder 20. The evaluation value of the width may be matched to at least the position deviation of the nozzle 41 and the change in the discharge rate of the removal liquid from the nozzle 41, the evaluation value of the eccentricity may be matched to at least the position deviation of the substrate W on the rotating holder 20, the evaluation value of the roundness may be matched to at least the distortion of the substrate W and the distortion of the rotating holder 20, and the evaluation value of the roughness may be matched to at least the liquid scattering of the removal liquid and the variation in the discharge rate of the removal liquid form the nozzle 41. In this case, it is possible to output more useful factor information.

The coating and developing apparatus 2 may further include the contribution level evaluation unit 122 configured to evaluate the contribution levels of the multiple kinds of feature amounts to the error based on the calculation result of the multiple kinds of feature amounts, and the factor estimation unit 124 may output the factor information based on the contribution levels of the multiple kinds of feature amounts to the error. In this case, it is possible to easily output more accurate factor information.

The factor estimation unit 124 may output the factor information based on at least one error factor, among the multiple kinds of error factors, matched to at least the feature amount having the highest contribution level. In this case, it is possible to output more knowable factor information.

The multiple kinds of feature amounts includes the composite feature amount matched to the multiple kinds of error factors, and when the feature amount having the highest contribution level is the composite feature amount, the factor estimation unit 124 may output the factor information based on the multiple kinds of error factors matched to the composite feature amount and the state of the coating unit U1. In this case, it is possible to output more accurate factor information.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

According to the present disclosure, it is possible to provide the substrate processing apparatus that is effective in rapidly adjusting the removal width of the film formed on the substrate.

We claim:

1. An estimation method of a substrate processing performed by a substrate processing apparatus in which a peripheral portion of a film formed on a surface of a substrate is removed, comprising:
    acquiring a removal width profile indicating a relationship between a position in a circumferential direction of the substrate and a width of a portion of the substrate from which the film is removed;
    calculating multiple kinds of feature amounts matched to at least one error factor based on the removal width profile; and
    outputting factor information indicating a factor of an error in the width based on the removal width profile and a calculation result of the multiple kinds of feature amounts,
    wherein the multiple kinds of feature amounts include at least one of an evaluation value of a roundness of a periphery of the film and an evaluation value of a roughness of the periphery of the film.

2. The estimation method of claim 1, further comprising:
    evaluating the width based on the removal width profile,
    wherein in the outputting of the factor information, the factor information is output when an evaluation result of the width is out of a predetermined range.

3. The estimation method of claim 1,
    wherein the multiple kinds of feature amounts further include at least one of an evaluation value of the width, and an evaluation value of an eccentricity of the periphery of the film with respect to a periphery of the substrate.

4. The estimation method of claim 3,
    wherein the substrate processing includes:
    holding and rotating the substrate; and
    discharging a removal liquid for removing the film toward a peripheral portion of the substrate which is held and rotated,
    wherein the evaluation value of the width is matched to at least a position deviation in the discharging and a change in a discharge rate of the removal liquid in the discharging,
    the evaluation value of the eccentricity is matched to at least a position deviation of the substrate in the holding and rotating,
    the evaluation value of the roundness is matched to at least a distortion of the substrate and a distortion of the holding and rotating, and
    the evaluation value of the roughness is matched to at least a liquid scattering of the removal liquid and a variation in the discharge rate of the removal liquid.

5. The estimation method of claim 1,
    evaluating contribution levels of the multiple kinds of feature amounts to an error based on the calculation result of the multiple kinds of feature amounts,
    wherein in the outputting of the factor information, the factor information is output based on the contribution levels of the multiple kinds of feature amounts to the error.

6. The estimation method of claim 5,
wherein in the outputting of the factor information, the factor information is output based on at least one error factor, among multiple kinds of error factors, matched to at least a feature amount having a highest contribution level.

7. The estimation method of claim 1,
wherein the multiple kinds of feature amounts include a composite feature amount matched to multiple kinds of error factors, and
in the outputting of the factor information, when a feature amount having a highest contribution level is the composite feature amount, the factor information is output based on multiple kinds of error factors matched to the composite feature amount and a state of the substrate processing.

\* \* \* \* \*